(12) United States Patent
Tsai et al.

(10) Patent No.: US 9,671,444 B2
(45) Date of Patent: Jun. 6, 2017

(54) CURRENT SIGNAL SENSING METHOD FOR SUPPLYING-END MODULE OF INDUCTION TYPE POWER SUPPLY SYSTEM

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 544 days.

(21) Appl. No.: 14/251,655

(22) Filed: Apr. 14, 2014

(65) Prior Publication Data

US 2014/0203822 A1    Jul. 24, 2014

Related U.S. Application Data

(63) Continuation-in-part of application No. 14/017,321, filed on Sep. 4, 2013, now Pat. No. 9,628,147, which
(Continued)

(30) Foreign Application Priority Data

Feb. 1, 2011 (TW) .............................. 100103836 A
May 3, 2013 (TW) .............................. 102115983 A
Jan. 8, 2014 (TW) .............................. 103100707 A

(51) Int. Cl.
*H01F 27/42* (2006.01)
*H01F 37/00* (2006.01)
(Continued)

(52) U.S. Cl.
CPC ............ *G01R 27/2611* (2013.01); *G06F 1/26* (2013.01); *G06F 1/266* (2013.01); *H02J 5/00* (2013.01);
(Continued)

(58) Field of Classification Search
CPC .... H02J 17/00; H02J 7/00; H02J 5/005; H02J 5/00; H02J 50/10; H02J 50/00; H02J 50/80; H02J 50/90; H04B 3/54
(Continued)

(56) References Cited

U.S. PATENT DOCUMENTS 4,393,516 A  7/1983  Itani
4,561,443 A  12/1985  Hogrefe
(Continued)

FOREIGN PATENT DOCUMENTS

CN  101252293 A  8/2008
CN  101834473 A  9/2010
(Continued)

*Primary Examiner* — Rexford Barnie
*Assistant Examiner* — Jagdeep Dhillon
(74) *Attorney, Agent, or Firm* — Winston Hsu

(57) ABSTRACT

A current signal sensing method for a supplying-end module of an induction type power supply system, wherein the supplying-end module includes a supplying-end coil and a resonant capacitor, includes serially connecting a current sensing element between the supplying-end coil and the resonant capacitor to obtain a current signal corresponding to a current of the supplying-end coil; and interpreting the current signal to retrieve data of a receiving-end module of the induction type power supply system.

29 Claims, 12 Drawing Sheets

Related U.S. Application Data is a continuation-in-part of application No. 13/541,090, filed on Jul. 3, 2012, now Pat. No. 9,075,587, and a continuation-in-part of application No. 13/212,564, filed on Aug. 18, 2011, now Pat. No. 8,941,267, which is a continuation-in-part of application No. 13/154,965, filed on Jun. 7, 2011, now Pat. No. 8,810,072.

(51) Int. Cl.
| | |
|---|---|
| *H01F 38/00* | (2006.01) |
| *G01R 27/26* | (2006.01) |
| *H04B 5/00* | (2006.01) |
| *H02J 5/00* | (2016.01) |
| *G06F 1/26* | (2006.01) |
| *H02M 3/335* | (2006.01) |
| *H02M 7/5387* | (2007.01) |

(52) U.S. Cl.
CPC ............ *H02J 5/005* (2013.01); *H04B 5/0031* (2013.01); *H04B 5/0037* (2013.01); *H04B 5/0075* (2013.01); *H02M 3/33576* (2013.01); *H02M 7/53871* (2013.01); *Y02B 70/1433* (2013.01); *Y02B 70/1441* (2013.01)

(58) Field of Classification Search
USPC .......... 307/104, 3, 80, 66, 64; 320/106, 108; 375/259; 323/299
See application file for complete search history.

(56) References Cited

U.S. PATENT DOCUMENTS

| | | | |
|---|---|---|---|
| 5,734,254 A | 3/1998 | Stephens | |
| 5,987,244 A | 11/1999 | Kau | |
| 6,122,329 A | 9/2000 | Zai | |
| 6,154,375 A | 11/2000 | Majid | |
| 6,184,651 B1 | 2/2001 | Fernandez | |
| 6,345,203 B1 | 2/2002 | Mueller | |
| 7,336,929 B2 | 2/2008 | Yasuda | |
| 7,720,452 B2 | 5/2010 | Miyahara | |
| 7,791,311 B2 | 9/2010 | Sagoo | |
| 7,847,438 B2 | 12/2010 | Jin | |
| 8,004,235 B2 | 8/2011 | Baarman | |
| 8,041,974 B2 | 10/2011 | Lin | |
| 8,072,310 B1 | 12/2011 | Everhart | |
| 8,098,043 B2 | 1/2012 | Lin | |
| 8,183,827 B2 | 5/2012 | Lyon | |
| 8,188,619 B2 | 5/2012 | Azancot | |
| 8,217,535 B2 | 7/2012 | Uchida et al. | |
| 8,217,621 B2 | 7/2012 | Tsai et al. | |
| 8,248,024 B2 | 8/2012 | Yuan et al. | |
| 8,358,103 B2 | 1/2013 | Eastlack | |
| 8,373,387 B2 | 2/2013 | Bourilkov et al. | |
| 8,412,963 B2 | 4/2013 | Tsai et al. | |
| 8,417,359 B2 | 4/2013 | Tsai et al. | |
| 8,541,975 B2 | 9/2013 | Park et al. | |
| 8,772,979 B2 | 7/2014 | Tsai | |
| 8,810,072 B2 | 8/2014 | Tsai | |
| 9,048,881 B2 | 6/2015 | Tsai | |
| 9,075,587 B2 | 7/2015 | Tsai | |
| 2006/0017550 A1 | 1/2006 | Yoshida | |
| 2006/0199146 A1* | 9/2006 | Mandelkern | A61B 1/00016 433/52 |
| 2007/0177533 A1 | 8/2007 | Palay | |
| 2008/0079392 A1 | 4/2008 | Baarman | |
| 2008/0231120 A1 | 9/2008 | Jin | |
| 2009/0009006 A1 | 1/2009 | Jin | |
| 2009/0026844 A1 | 1/2009 | Iisaka | |
| 2009/0033294 A1 | 2/2009 | Odajima | |
| 2009/0174263 A1* | 7/2009 | Baarman | H02J 5/005 307/104 |
| 2009/0267561 A1 | 10/2009 | Lin | |
| 2009/0271048 A1 | 10/2009 | Wakamatsu | |
| 2009/0284082 A1 | 11/2009 | Mohammadian | |
| 2009/0302800 A1 | 12/2009 | Shiozaki | |
| 2009/0322280 A1 | 12/2009 | Kamijo | |
| 2010/0007307 A1 | 1/2010 | Baarman | |
| 2010/0270867 A1 | 10/2010 | Abe | |
| 2010/0277003 A1 | 11/2010 | Von Novak et al. | |
| 2010/0279606 A1 | 11/2010 | Hillan | |
| 2011/0136550 A1 | 6/2011 | Maugars | |
| 2011/0158329 A1 | 6/2011 | Oettinger | |
| 2011/0159812 A1 | 6/2011 | Kim | |
| 2011/0176589 A1 | 7/2011 | Kolof | |
| 2011/0196544 A1 | 8/2011 | Baarman | |
| 2011/0204711 A1* | 8/2011 | Norconk | H02J 5/005 307/3 |
| 2011/0204723 A1 | 8/2011 | Irish | |
| 2011/0264945 A1 | 10/2011 | Tsai | |
| 2011/0278949 A1 | 11/2011 | Tsai | |
| 2011/0285212 A1 | 11/2011 | Higuma | |
| 2012/0025622 A1 | 2/2012 | Kim | |
| 2012/0149303 A1 | 6/2012 | Moes | |
| 2012/0200278 A1* | 8/2012 | Yost | F42C 11/008 323/299 |
| 2012/0272076 A1 | 10/2012 | Tsai | |
| 2012/0293009 A1 | 11/2012 | Kim | |
| 2012/0328061 A1 | 12/2012 | Chow | |
| 2013/0015705 A1 | 1/2013 | Abe | |
| 2013/0094598 A1* | 4/2013 | Bastami | H02J 5/005 375/259 |
| 2013/0127407 A1* | 5/2013 | Kao | H02J 17/00 320/108 |
| 2013/0162204 A1 | 6/2013 | Jung | |
| 2013/0175873 A1 | 7/2013 | Kwon | |
| 2013/0176023 A1 | 7/2013 | Komiyama | |
| 2013/0234532 A1 | 9/2013 | Fells | |
| 2013/0253898 A1* | 9/2013 | Meagher | G06F 17/5009 703/18 |
| 2014/0024919 A1 | 1/2014 | Metzenthen | |
| 2014/0084857 A1 | 3/2014 | Liu | |
| 2014/0152251 A1 | 6/2014 | Kim | |
| 2015/0008756 A1 | 1/2015 | Lee | |
| 2015/0028875 A1 | 1/2015 | Irie | |
| 2015/0054355 A1 | 2/2015 | Ben-Shalom | |
| 2015/0207333 A1* | 7/2015 | Baarman | H02J 17/00 307/104 |

FOREIGN PATENT DOCUMENTS

| | | |
|---|---|---|
| CN | 101978571 A | 2/2011 |
| CN | 101272063 B | 1/2012 |
| CN | 102315692 A | 1/2012 |
| CN | 102710409 A | 10/2012 |
| CN | 102804619 A | 11/2012 |
| CN | 102904475 A | 1/2013 |
| CN | 103248130 A | 8/2013 |
| CN | 103424133 A | 12/2013 |
| CN | 103425169 A | 12/2013 |
| CN | 103595144 A | 2/2014 |
| CN | 103975497 A | 8/2014 |
| CN | 105449875 A | 3/2016 |
| EP | 2608419 A2 | 6/2013 |
| EP | 2 793 355 A1 | 10/2014 |
| JP | 200660909 A | 3/2006 |
| JP | 2008206305 A | 9/2008 |
| JP | 2010213414 A | 9/2010 |
| JP | 2013135518 A | 7/2013 |
| TW | M246884 | 10/2004 |
| TW | 200527302 | 8/2005 |
| TW | 201018042 | 5/2010 |
| TW | 201034334 A1 | 9/2010 |
| TW | 201123673 | 7/2011 |
| TW | 201123676 | 7/2011 |
| TW | 201128972 | 8/2011 |
| TW | 201138258 | 11/2011 |
| TW | 201234871 | 8/2012 |
| TW | 201243281 | 11/2012 |
| TW | 201251389 | 12/2012 |
| TW | I389416 | 3/2013 |

(56) References Cited

FOREIGN PATENT DOCUMENTS

| | | |
|---|---|---|
| TW | 201315082 | 4/2013 |
| TW | I408861 | 9/2013 |
| TW | 201412047 | 3/2014 |
| TW | 201414130 | 4/2014 |
| TW | 201415752 | 4/2014 |
| TW | 201417445 | 5/2014 |
| TW | 201440368 A | 10/2014 |
| TW | I459676 B | 11/2014 |
| TW | I472897 | 2/2015 |
| TW | I483509 B | 5/2015 |
| WO | 2009149464 A2 | 12/2009 |

* cited by examiner

CURRENT SIGNAL SENSING METHOD FOR SUPPLYING-END MODULE OF INDUCTION TYPE POWER SUPPLY SYSTEM

CROSS REFERENCE TO RELATED APPLICATIONS

This application is a continuation-in-part of U.S. application Ser. No. 14/017,321, filed on Sep. 4, 2013 and titled "Method of automatically adjusting determination voltage and voltage adjusting device thereof", which is further a continuation-in-part of U.S. application Ser. No. 13/212,564, filed on Aug. 18, 2011 and a continuation-in-part of U.S. application Ser. No. 13/541,090, filed on Jul. 3, 2012, wherein U.S. application Ser. No. 13/212,564 is further a continuation-in-part of U.S. application Ser. No. 13/154,965, filed on Jun. 7, 2011.

BACKGROUND OF THE INVENTION

1. Field of the Invention

The present invention relates to a current signal sensing method for a supplying-end module of an induction type power supply system and a related receiving-end module, and more particularly, to a current signal sensing method capable of detecting current signals in a supplying-end module of an induction type power supply system, in order to use the time difference between currents and driving signals to interpret the load status and existence of metal objects, retrieve modulated signals and data by automatically adjusting voltage levels for triggering the current signals, and retrieve modulated signals and data by interpreting the difference between half-cycle current signals. The present invention also discloses a related receiving-end module.

2. Description of the Prior Art

For safety purposes, a power supply device of an induction type power supply system has to ensure that a proper power receiving device is positioned on the sensing area of a supplying-end coil of the power supply device, and that the power receiving device is ready to receive power before the power is supplied. In order to allow the power supply device to confirm the above conditions, a data code should be transmitted for identification purposes. The data code transmission is performed via the following steps: the power supply device drives the supplying-end coil to generate resonance and sends electromagnetic power to the power receiving device in order to transmit power. When the power receiving device receives the power, the power receiving device may change the impedance on the receiving-end coil via the signal modulation technology, and any variations are fed back to vary the amplitude of carriers on the supplying-end coil. In the prior art, the variations in voltage and current which occur on the amplitude of carriers on the supplying-end coil should be retrieved through a coil voltage detection circuit. The retrieved voltage variations on the carriers (AC signals with a high frequency) should be filtered by a low-pass filter to obtain differential DC signals, and the current variations should also be converted to voltage signals for processing. The variations in these signals are quite small and thus require amplification before the modulated signals are retrieved. U.S. application Ser. No. 14/017,321 uses a signal analysis circuit to perform low-pass filtering and DC voltage level decoupling, and other circuits (e.g. comparators) are incorporated to convert these small variations of the modulated signals into digital signals. The modulated signals are then able to be interpreted and decoded via software in the microprocessor.

The structure of the circuit in the abovementioned prior art has some drawbacks, however. The variations in the voltage and current may not be sufficiently clear and stable. When the signals enter the signal analysis circuit at the back-end, these small signals may not be interpreted if the amplification ratio is too small, or may easily be blended with noise if the amplification ratio is too large. Circuit design is therefore difficult, which causes unreliability. The variations in the voltage and current may be different due to disposition of the coil, magnitude of transmitted power or other reasons. If the transmitted power is increased, the modulation ratio (i.e. the ratio of magnitudes of the resonant carriers and the modulated signals) may be reduced and the difficulty of interpreting the data codes may increase accordingly, such that the signal modulation capability will diminish as it approaches a full-load status. The signals should undergo filtering before being interpreted; hence, the variations in the modulated signals on the carriers require several cycles to pass through the filter. A cycle of the modulated signals should be greater than the time for allowing the signals to pass through the filter and become stable, which limits the speed of data transmission. The prior art is only applicable to signal sensing, and the load status of the coil, such as whether the coil is full-load or whether there is any metal object, cannot be obtained. Finally, the signal analysis circuit requires a large number of electronic elements, which increases the cost. More elements may also induce lower reliability, as the circuit may fail when any one of these elements fails. Thus, there is a need for improvement over the prior art.

SUMMARY OF THE INVENTION

It is therefore an objective of the present invention to provide a current signal sensing method for a supplying-end module of an induction type power supply system and a corresponding receiving-end module. The current signal sensing method is capable of performing detection on current signals in the induction type power supply system, in order to use the time difference between currents and driving signals to interpret the load status and existence of metal objects, retrieve modulated signals by automatically adjusting voltage levels for triggering the current signals, and retrieve modulated signals by interpreting the difference between half-cycle current signals.

The present invention discloses a current signal sensing method for a supplying-end module of an induction type power supply system, wherein the supplying-end module comprises a supplying-end coil and a resonant capacitor. The current signal sensing method comprises serially connecting a current sensing element between the supplying-end coil and the resonant capacitor to obtain a current signal corresponding to a current of the supplying-end coil; and interpreting the current signal to retrieve data of a receiving-end module of the induction type power supply system.

The present invention further discloses a supplying-end module for an induction type power supply system. The supplying-end module comprises a supplying-end coil; a resonant capacitor; a current sensing element, serially connected between the supplying-end coil and the resonant capacitor, for obtaining a current signal corresponding to a current of the supplying-end coil; and a control unit, coupled to the current sensing element, for interpreting the current signal to retrieve data of a receiving-end module of the induction type power supply system.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
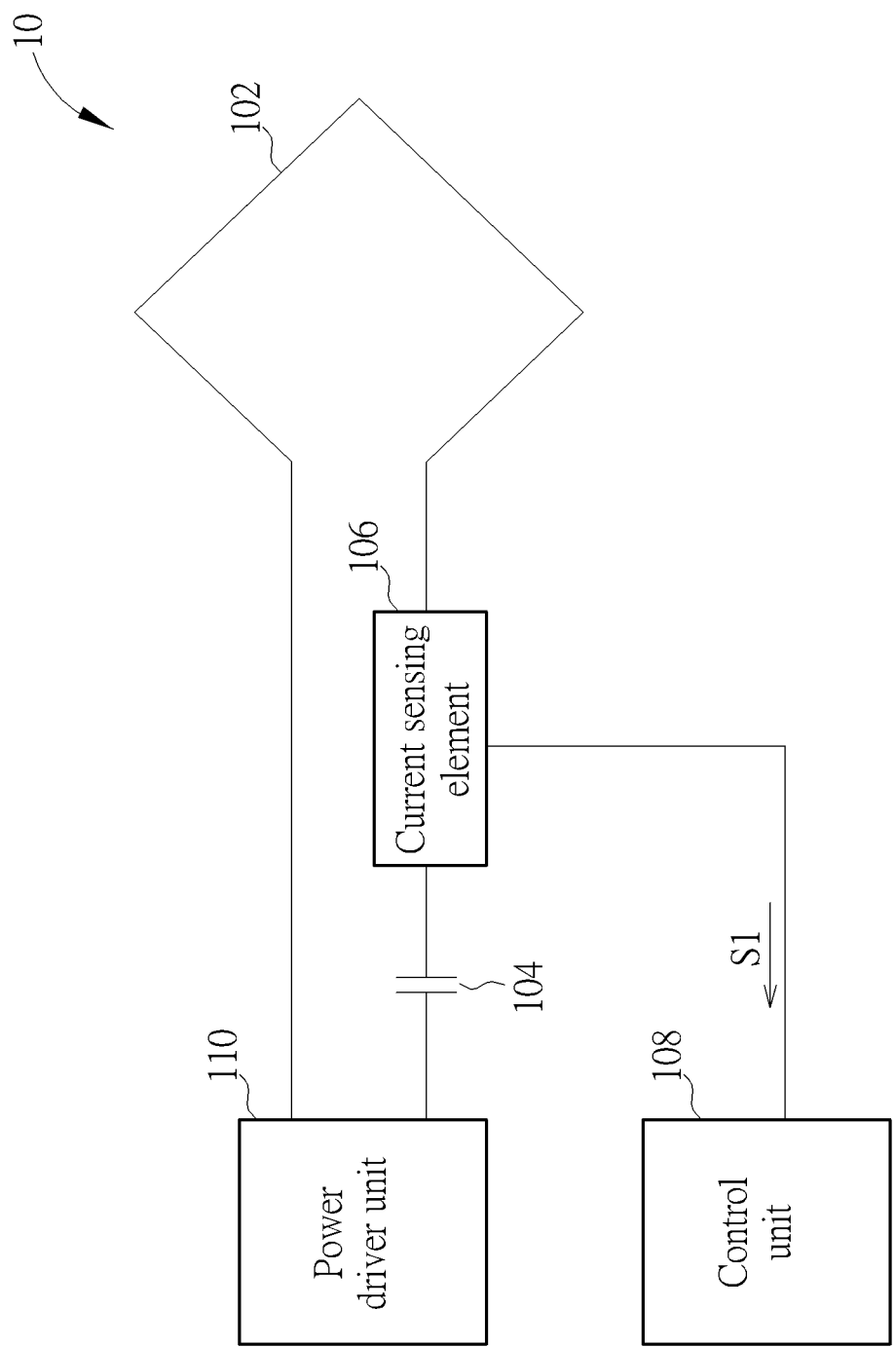
FIG. 1 is a schematic diagram of a supplying-end module according to an embodiment of the present invention.

Please refer to FIG. 1, which is a schematic diagram of a supplying-end module 10 according to an embodiment of the present invention. As shown in FIG. 1, the supplying-end module 10, which is utilized in an induction type power supply system, includes a supplying-end coil 102, a resonant capacitor 104, a current sensing element 106, a control unit 108 and a power driver unit 110. The supplying-end coil 102 supplies power to the power receiving end and receives feedback signals from the power receiving end. The resonant capacitor 104 is incorporated with the supplying-end coil 102 to generate resonance, in order to generate electromagnetic power. The current sensing element 106, serially connected between the supplying-end coil 102 and the resonant capacitor 104, is utilized for obtaining a current signal S1 corresponding to the current of the supplying-end coil 102. The current sensing element 106 may be a current sensing resistor, a Hall Effect current sensor or current sensors of other types. The control unit 108, coupled to the current sensing element 106, is utilized for interpreting the current signal S1, in order to retrieve data of a receiving-end module of the induction type power supply system. The power driver unit 110 is utilized for driving the supplying-end coil 102 to deliver power.

In comparison with the prior art wherein low-pass filtering should be performed on voltage signals or current signals before these signals are interpreted, the supplying-end module 10 may directly interpret the current signal S1 and obtain the modulated signals without filtering, such that the control unit 108 may directly interpret the AC signals generated on the coil. It is difficult to retrieve accurate current values in AC signals, however; especially in a wireless charging system, where AC components may have a higher frequency and larger current, and thus may not be processed easily. In such a situation, the modulated signals may be obtained by performing comparison on the current magnitude and determining whether trigger signals are generated by the current. In addition, detection of current direction may be applied to determine the load status.

In an embodiment, the supplying-end module 10 may obtain load information from the change of current direction, which gives an indication as to the load status of the induction type power supply system and the existence of metal objects in the load terminal of the induction type power supply system. Please refer to FIG. 2, which is a schematic diagram of an implementation of the supplying-end module 10 shown in FIG. 1. In this embodiment, the power driver unit 110 may perform full-bridge driving on the supplying-end coil 102; hence, the power driver unit 110 includes two parts: the power driver units 110A and 110B. The power driver unit 110A includes a driver 121A, a high-side switch 123A and a low-side switch 124A; the power driver unit 110B includes a driver 121B, a high-side switch 123B and a low-side switch 124B. The supplying-end module 10 further includes a power supplying unit 210 and a display unit 220. The operations of the power supplying unit 210 and the display unit 220 are disclosed in U.S. application Ser. No. 14/017,321, and will not be narrated herein.

Figure 3:
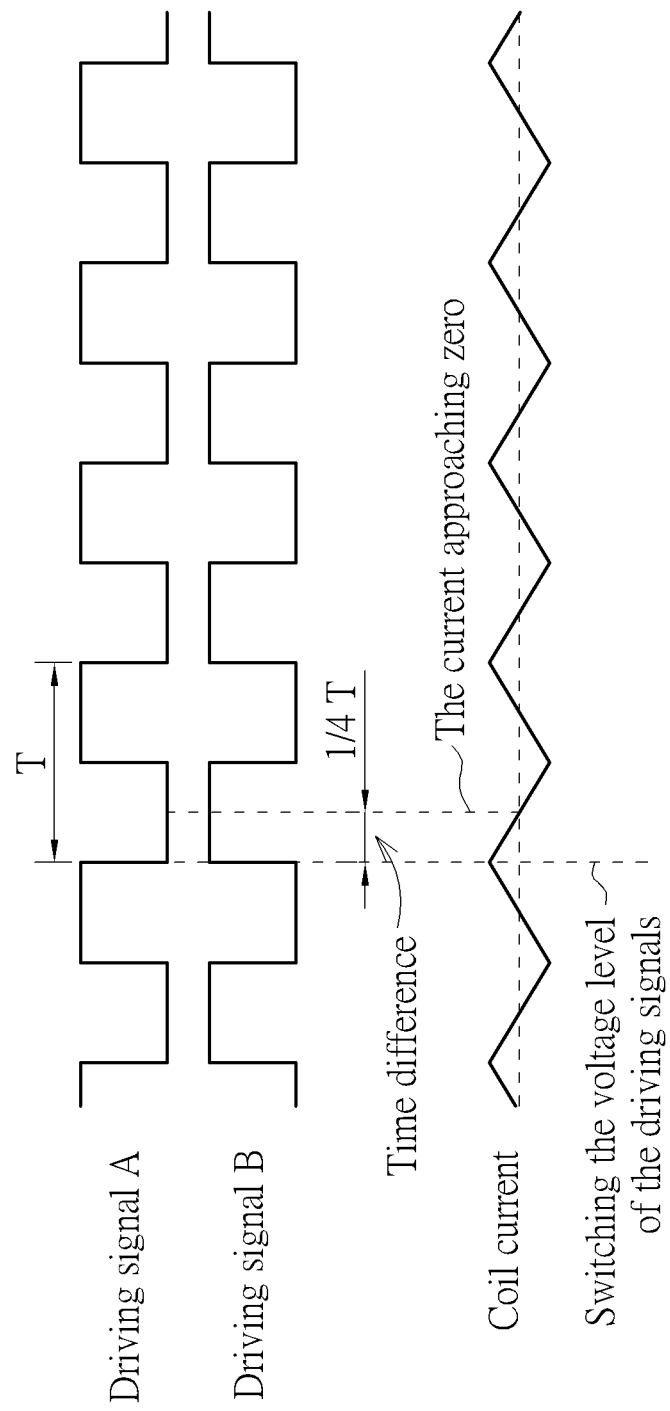
FIG. 3 is a waveform diagram of driving signals and the coil current when the induction type power supply system is in a no-load status according to an embodiment of the present invention.

In order to obtain the load information of the induction type power supply system, the time points of switching driving signals in both terminals of the supplying-end coil 102 and the coil current approaching zero may be considered. Please refer to FIG. 3, which is a waveform diagram of driving signals A and B and the coil current when the induction type power supply system is in a no-load status according to an embodiment of the present invention. The driving signals A and B, which are switching signals for controlling the power driver units 110A and 110B, respectively, may drive the supplying-end coil 102 and the resonant capacitor 104 to generate resonance via the circuit elements in the power driver units 110A and 110B. FIG. 3 illustrates a full-bridge driving, where the driving signals A and B are switching signals that are inverse to each other. As shown in FIG. 3, the driving signals A and B drag the current in the supplying-end coil 102. The current passing through the coil may not face any obstructions and will therefore appear to be a triangular wave in the no-load status, where the current flows bi-directionally between the supplying-end coil 102 and the resonant capacitor 104. When the current flows bi-directionally, there may be a time point when no current flows, i.e. the current approaches zero. In each driving cycle T, the current may approach zero twice. As for the driving signal A, the current may be pulled to increase when it is in a higher voltage level. After the driving signal A decreases to a lower voltage level, the current may also start to decrease. In the no-load status, the time difference between switching the voltage level of the driving signal A and the current approaching zero is substantially equal to a quarter of one switching cycle T.

Figure 4:
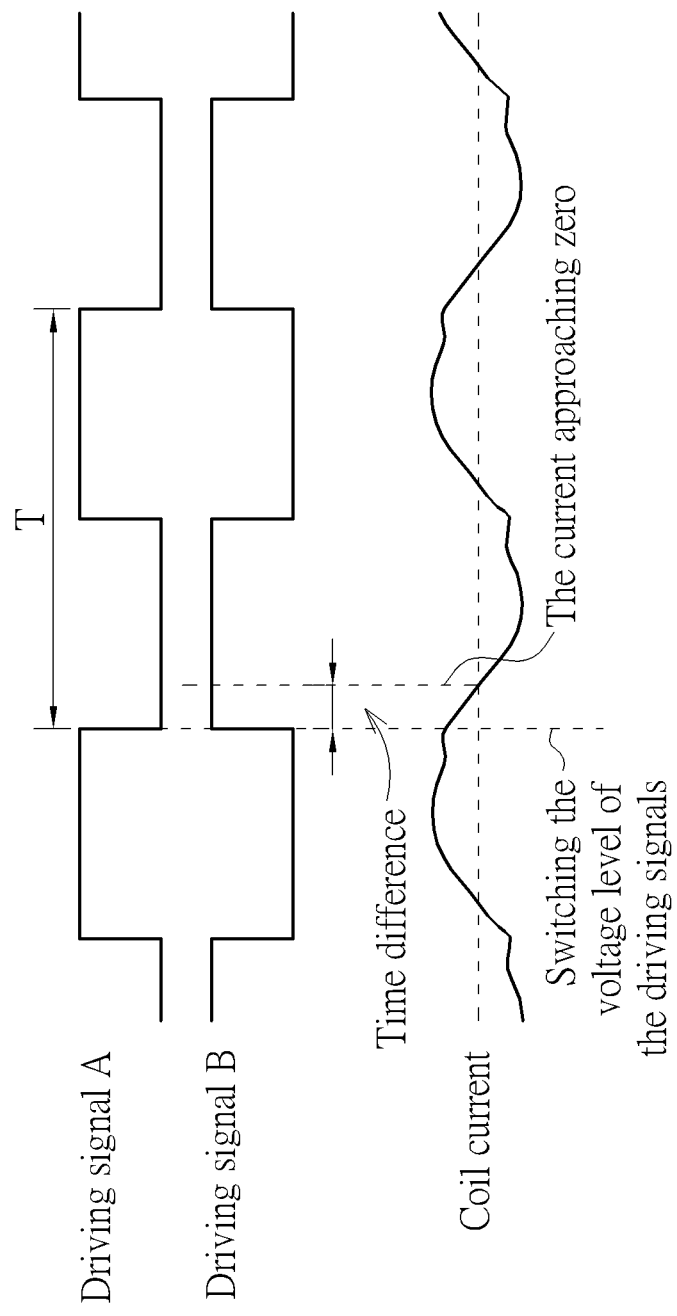
FIG. 4 is a waveform diagram of the driving signals and the coil current when a load is inserted in the induction type power supply system according to an embodiment of the present invention.

Please refer to FIG. 4, which is a waveform diagram of the driving signals A and B and the coil current when a load is inserted in the induction type power supply system according to an embodiment of the present invention. As shown in FIG. 4, after the load is inserted, resonant interaction is generated between the supplying-end coil 102, the resonant capacitor 104 and the coil and capacitor of the power receiving end, so that the coil current starts to vary. With the increase of the load, the time point of the current approaching zero may gradually near the time point of switching the driving signal A to the lower voltage level.

Figure 5:
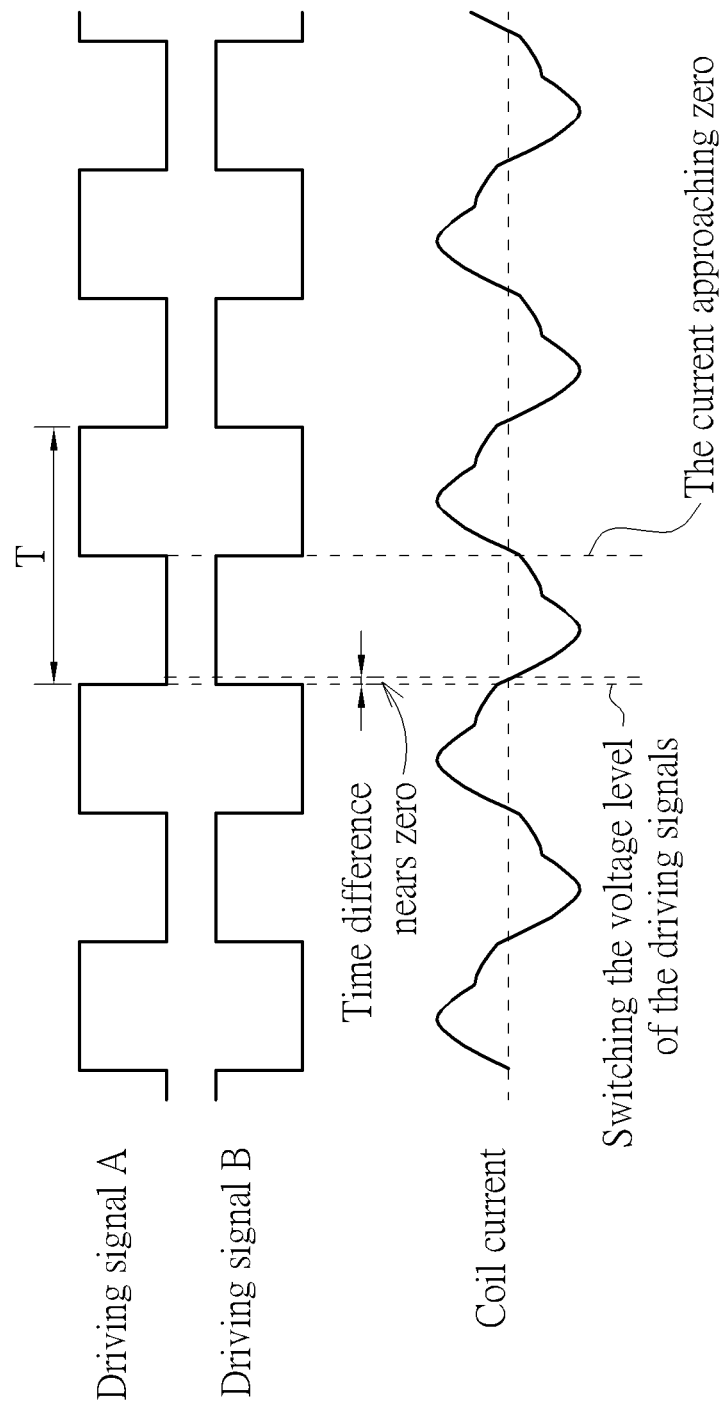
FIG. 5 is a waveform diagram of the driving signals and the coil current when the induction type power supply system is in a full-load status according to an embodiment of the present invention.

Please refer to FIG. 5, which is a waveform diagram of the driving signals A and B and the coil current when the induction type power supply system is in a full-load status according to an embodiment of the present invention. When the induction type power supply system is in the full-load status, the supplying-end module 10 has the maximum driving capability to the power receiving end (i.e. the maximum power transmission). After the load increases beyond this status, the power and charging efficiency will fall. As shown in FIG. 5, in the full-load status, the time point of switching the voltage level of the driving signal A may substantially be equal to the time point of the current approaching zero. When the induction type power supply system is overloaded, the time point of switching the voltage level of the driving signal A may fall behind the time point of the current approaching zero.

The control unit 108 may determine the load status of the induction type power supply system according to the time difference between the time point of switching the driving signal A from the higher voltage level to the lower voltage level and the time point of the current approaching zero, in order to obtain the load information. When the time difference between the time point of switching the voltage level of the driving signal A and the time point of the current approaching zero is substantially equal to a quarter of the switching cycle T of the driving signal A, the control unit 108 may determine that the induction type power supply system has no load. When the time difference between the time point of switching the voltage level of the driving signal A and the time point of the current approaching zero is smaller than a quarter of the switching cycle T of the driving signal A, the control unit 108 may determine that the induction type power supply system has a load. When the time difference between the time point of switching the voltage level of the driving signal A and the time point of the current approaching zero nears zero, the control unit 108 may determine that the induction type power supply system is almost full loaded. Since the driving signal B is inverse to the driving signal A, the time point of switching the voltage level of the driving signal B may also be incorporated with the time point of the current approaching zero to determine the load status, where the determination method is the same as the above method for applying the driving signal A. This will not be narrated herein.

In this embodiment, the current sensing element 106 only obtains the time point of the current approaching zero when the current changes direction. In other words, the current sensing element 106 retrieves the direction of the current to perform signal interpretation without considering the magnitude of the current. A zero current comparator 230 may be disposed in the output terminal of the current sensing element 106, in order to generate an output value corresponding to the current direction. For example, the zero current comparator 230 may output 1 (a higher voltage level) when the current flows forward, and output 0 (a lower voltage level) when the current flows backward. Since the information required by the control unit 108 is the time point of the current approaching zero, it should not be limited to which direction is forward (or which direction is backward). As a result, the zero current comparator 230 may transmit the current direction information to the control unit 108, where the information excludes the magnitude of the current. The control unit 108 may calculate the time point of the current approaching zero according to the output signal of the zero current comparator 230.

Please note that the current signal S1 may not be transmitted to the comparator or control unit in the back end in a current form; instead, the current signal S1 may also be transmitted in a voltage form, digital form or other forms. For example, in the above embodiments, the current sensing element 106 may include a resistor serially connected between the supplying-end coil 102 and the resonant capacitor 104. The current signal S1 may be a voltage difference between the two terminals of the resistor, and the current sensing element 106 then transmits the current signal S1 to the zero current comparator 230 to be compared with zero voltage. In such a situation, the current signal S1 is a signal corresponding to the coil current in a voltage form, and utilized to be compared with zero voltage to determine the direction of the coil current.

In an embodiment, the control unit 108 includes a timer for calculating the time difference between the time point of the current approaching zero and the time point of switching the voltage levels of the driving signals A and B. The control unit 108 may start the timer when the voltage levels of the driving signals A and B are switched, and stops the timer when the current signal S1 is switched from 1 to 0 or from 0 to 1 (i.e. the time point of the current approaching zero). The control unit 108 may determine the load status of the induction type power supply system according to the length of time obtained by the timer and the switching cycle T of the driving signals A and B.

Regardless of whether the induction type power supply system is in a no-load, heavy-load or full-load status, the current magnitude of the supplying-end coil 102 cannot be interpreted easily, but the current may approach zero at particular time points. These time points can then be utilized for performing signal interpretation. Since filtering is not required for the current signal, the processing time for filtering the signal does not need to be taken into consideration; hence, the speed of signal processing can be enhanced. In comparison with the prior art wherein detection of the load status of the coil should be limited to analysis of currents and voltages via analog amplifiers or filtering circuits, the present invention can analyze the load status using a timer, which requires fewer elements and thus has the benefits of low cost and high reliability. Based on the current signal processing technologies, the speed and capability of a processor are far higher than those of an analog processing circuit, and the signal processing capability will thereby be enhanced via the control unit 108. In addition, the interpretation of time difference of the present invention may also be utilized for determining whether there is any metal object in the load terminal.

Figure 6:
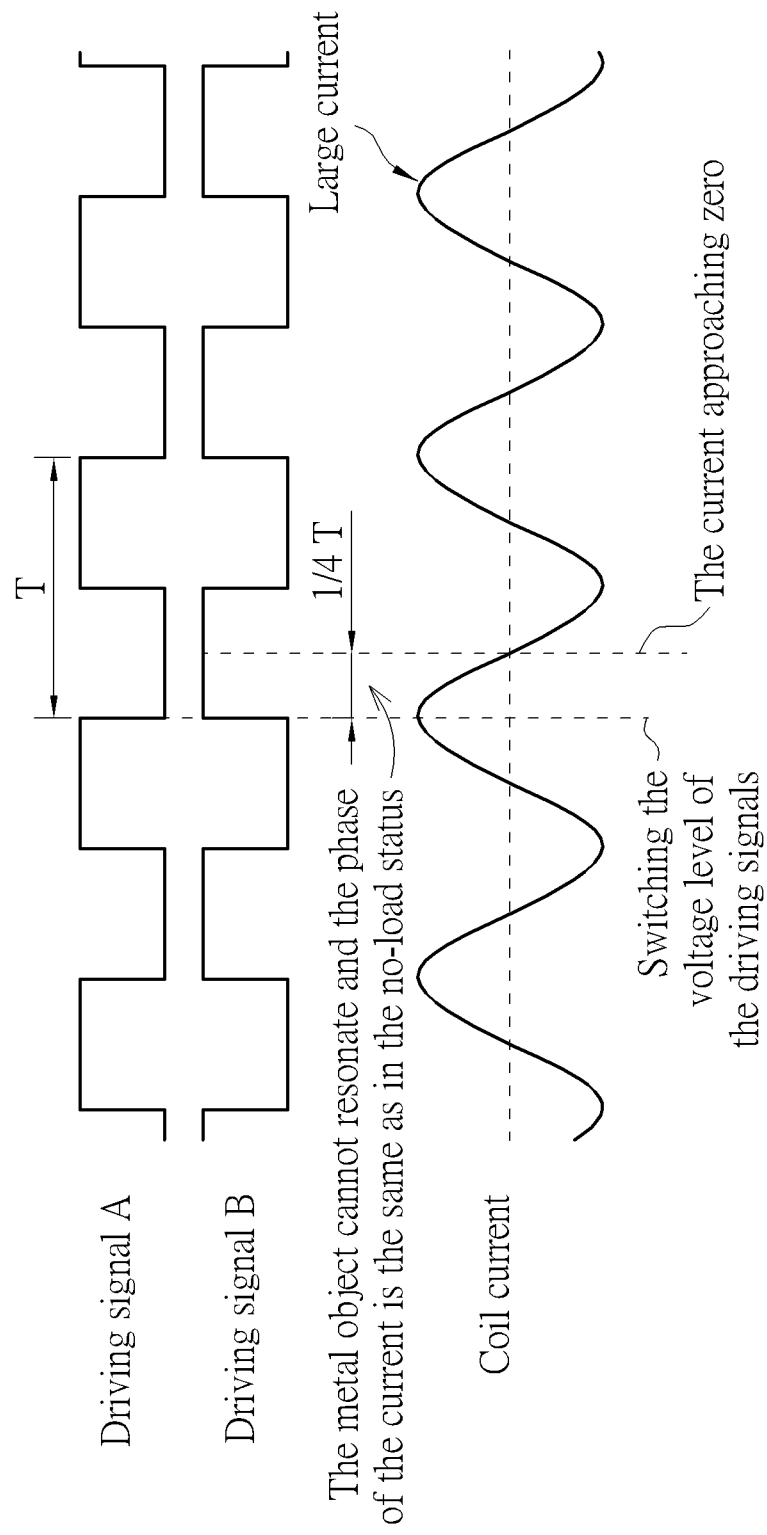
FIG. 6 is a waveform diagram of the driving signals and the coil current when a metal object exists in the power receiving end of the induction type power supply system according to an embodiment of the present invention.

Please refer to FIG. 6, which is a waveform diagram of the driving signals A and B and the coil current when a metal object exists in the power receiving end of the induction type power supply system according to an embodiment of the present invention. As shown in FIG. 6, when the metal object exists in the power receiving end, large current and voltage variations may be generated in the supplying-end coil 102. The metal object cannot interact with the resonance of the supplying-end coil 102; hence, the phase of the current may still be the same as in the no-load status; that is, the time point of the current approaching zero may still fall behind the time point of switching the voltage level of the driving signal A by a quarter of the switching cycle T. As a result, the control unit 108 may determine whether there is any metal object in the power receiving end via the current magnitude and the time point of the current approaching zero relative to the time point of switching the voltage level of the driving signal A.

Please note that the present invention may obtain the data of the power receiving end by detecting current variations in the supplying-end coil without filtering operations. In the abovementioned embodiments, the obtained data may be information related to loading status of the coil or existence of any metal object in the load terminal. For the wireless charging technology, the purpose of obtaining this data is to determine whether an accurate power receiving device is located in the power receiving end via interpretation of the modulated data. In the following embodiments, the current signal S1 obtained by the current sensing element 106 will be utilized for interpreting the modulated signal generated by the receiving-end module, in order to obtain the modulated data.

Figure 2:
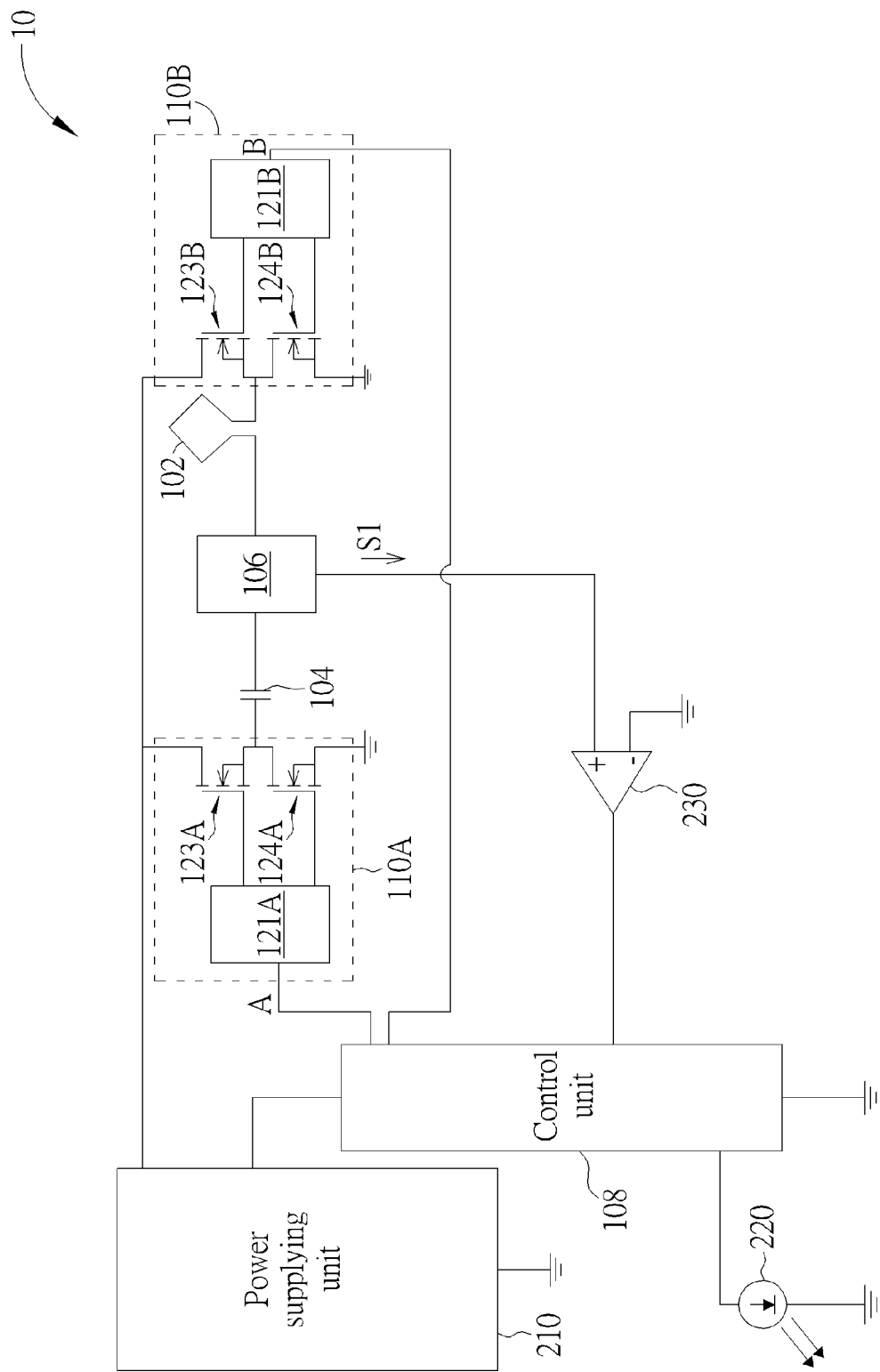
FIG. 2 is a schematic diagram of an implementation of the supplying-end module shown in FIG. 1.
Figure 7:
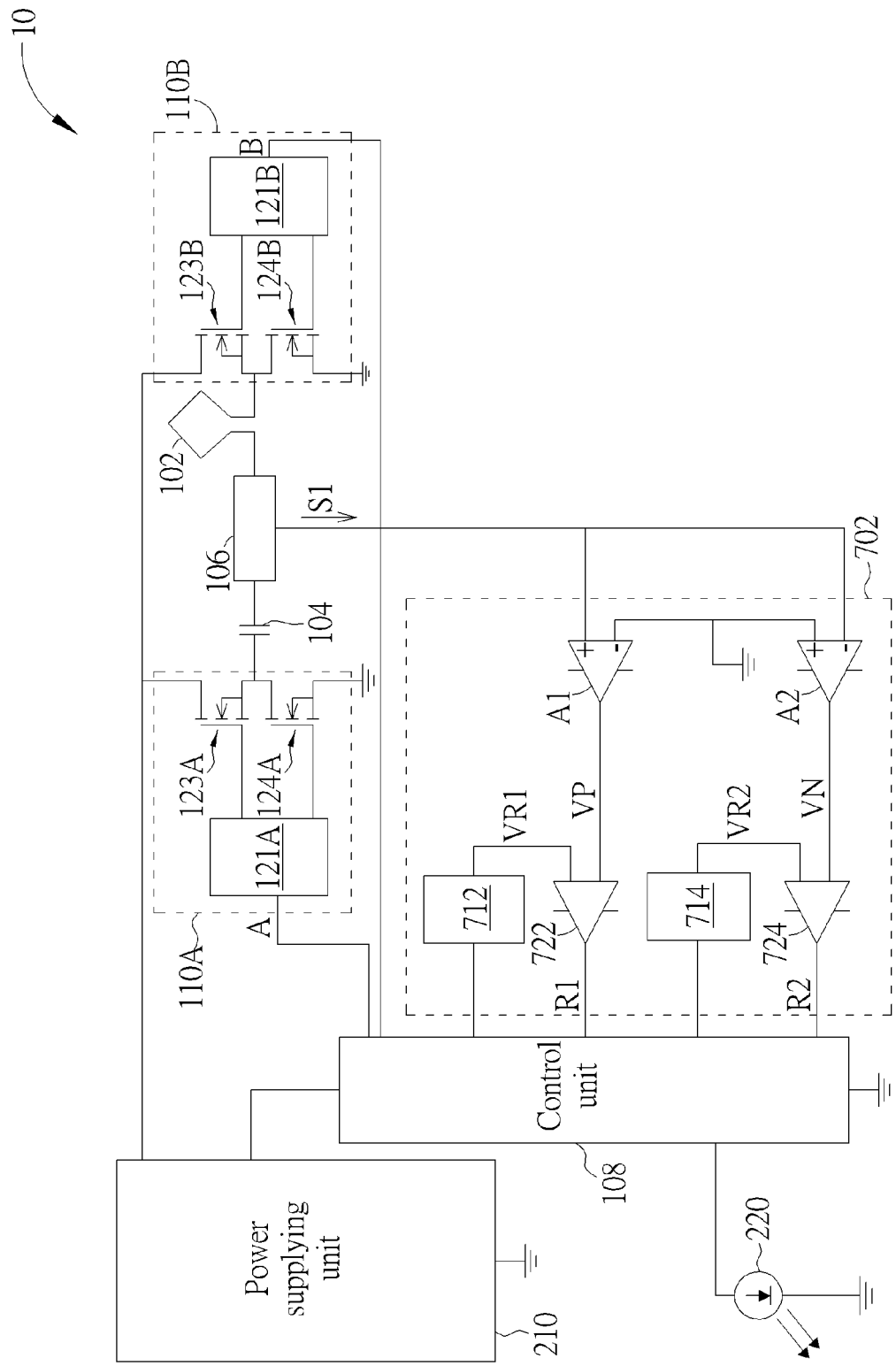
FIG. 7 is a schematic diagram of another implementation of the supplying-end module.

Please refer to FIG. 7, which is a schematic diagram of another implementation of the supplying-end module 10. The structure of the supplying-end module 10 shown in FIG. 7 is the same as that of the supplying-end module 10 shown in FIG. 2; hence, elements and signals having the same functions are denoted by the same symbols. The main difference between the supplying-end modules 10 shown in FIG. 7 and FIG. 2 is that the supplying-end module 10 of FIG. 7 further includes a signal interpretation circuit 702, which includes amplifiers A1 and A2, voltage generators 712 and 714, a positive half-cycle comparator 722 and a negative half-cycle comparator 724. The amplifiers A1 and A2 may receive the current signal S1 and respectively amplify a forward part and a backward part of the corresponding current of the current signal S1. The forward part and the backward part are then converted into a positive voltage signal VP and a negative voltage signal VN, respectively. The amplifier A1 directly amplifies the forward part of the corresponding current of the current signal S1 and converts it into the positive voltage signal VP, and the amplifier A2 inverts the backward part of the corresponding current of the current signal S1 and then amplifies it, in order to generate the negative voltage signal VN. The current signal S1 obtained by the current sensing element 106 is small and usually requires amplification for subsequent processing. The negative part may first be inverted to a positive signal, in order to undergo signal processing by the processor in the back end. The voltage generators 712 and 714 are utilized for generating reference voltages VR1 and VR2, respectively. The positive half-cycle comparator 722 may compare the positive voltage signal VP with the reference voltage VR1, and trigger a positive half-cycle part of the modulated signal when the positive voltage signal VP is greater than the reference voltage VR1. The negative half-cycle comparator 724 may compare the negative voltage signal VN with the reference voltage VR2, and trigger a negative half-cycle part of the modulated signal when the negative voltage signal VN is greater than the reference voltage VR2.

Each time the power driver unit 110 is driven to supply power, the supplying-end coil 102 and the resonant capacitor 104 may resonate and generate AC power. The current of the AC power may vary based on sensing status and driving status of the supplying-end coil, and these variations may be converted into the current signal S1 via the current sensing element 106. Since both the coil current and the current signal S1 are not low-pass filtered, the current signal S1 has a high frequency and is not easily converted into a digital signal via an analog-to-digital converter (ADC). In such a situation, the reference voltage VR1 or VR2 may be predefined, and may be adjusted according to the ratio of the positive voltage signal VP being greater than the reference voltage VR1 or the ratio of the negative voltage signal VN being greater than the reference voltage VR2 during a specific period in which no modulated signals are generated in the receiving-end module.

Figure 8:
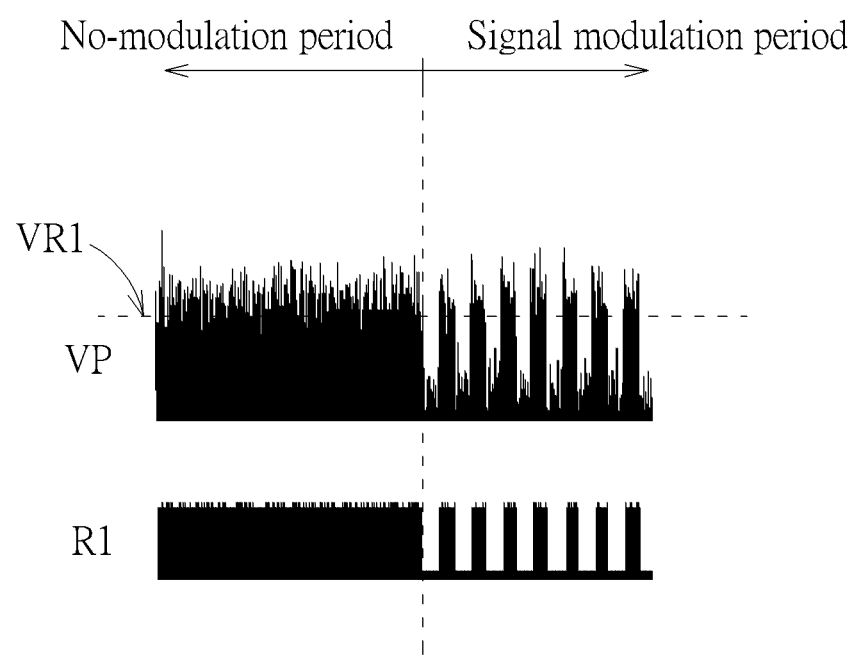
FIG. 8 is a waveform diagram of the positive voltage signal and an output result of the positive half-cycle comparator during a no-modulation period and a signal modulation period according to an embodiment of the present invention.

Take the signal interpretation of the positive-half cycle as an example. Please refer to FIG. 8, which is a waveform diagram of the positive voltage signal VP and an output result R1 of the positive half-cycle comparator 722 during a no-modulation period and a signal modulation period according to an embodiment of the present invention. As shown in FIG. 8, during the no-modulation period in which no modulated signals are generated in the receiving-end module, the current signal S1 corresponding to the coil current may fluctuate with noise or the coil coupling status, and these fluctuations are coupled to the positive voltage signal VP. When the positive voltage signal VP is greater than the reference voltage VR1, the positive half-cycle comparator 722 may output a value R1=1. When the positive voltage signal VP is smaller than the reference voltage VR1, the positive half-cycle comparator 722 may output a value R1=0. In this embodiment, the control unit 108 may check whether each positive voltage signal VP is greater than the reference voltage VR1 and triggers the positive half-cycle comparator 722 to generate the output result R1=1 during a specific period in which no modulated signals are generated in the receiving-end module. The control unit 108 may further calculate a ratio of the positive voltage signal VP triggering and generating the output result R1=1 during this specific period. When the triggering ratio is too high, the control unit 108 may increase the level of the reference voltage VR1 to decrease the triggering ratio. When the triggering ratio is too low, the control unit 108 may decrease the level of the reference voltage VR1 to increase the triggering ratio. When the triggering ratio is moderate, the control unit 108 may keep the level of the reference voltage VR1. For example, the control unit 108 may control the ratio of the current signal S1 triggering and generating R1=1 to be between 70% and 80%. If the triggering ratio of the current signal S1 during a period is determined to be greater than 80%, the control unit 108 may increase the level of the reference voltage VR1 to decrease the subsequent triggering ratio of the current signal S1. If the triggering ratio of the current signal S1 during a period is determined to be smaller than 70%, the control unit 108 may decrease the level of the reference voltage VR1 to increase the subsequent triggering ratio of the current signal S1. As a result, when larger system noises exist which cause an increase of the triggering ratio, the control unit 108 may increase the level of the reference voltage VR1 to decrease the triggering ratio, in order to prevent an incorrect determination of the modulated signals due to noise interference.

Figure 9:
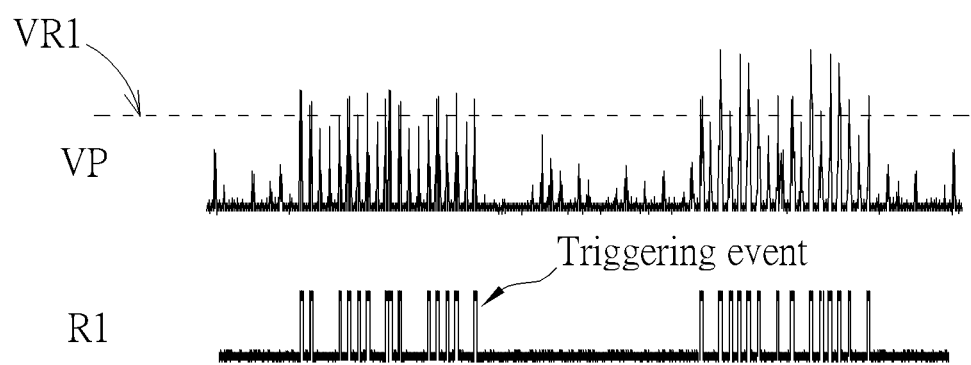
FIG. 9 is a waveform diagram of the positive voltage signal and the output result of the positive half-cycle comparator during a signal modulation period according to an embodiment of the present invention.

Please refer to FIG. 9, which is a waveform diagram of the positive voltage signal VP and the output result R1 of the positive half-cycle comparator 722 during a signal modulation period according to an embodiment of the present invention. FIG. 9 is a zoomed-out diagram of the waveform of the signal modulation period shown in FIG. 8 for easy illustration. As mentioned above, after the reference voltage VR1 is predefined, the ratio of the current signal S1 triggering the output R1=1 may fall between 70% and 80% during a period of time in which no modulated signals are generated in the power receiving end. There may be no triggering events (i.e. the output result R1 is always 0) or a few triggering events over a longer period of time, which means that the power receiving end may start to modulate signals, as shown in FIG. 9. During the signal modulation period, there may exist a higher triggering ratio during a period of time (e.g. 70%-80%), and a relatively low triggering ratio during another period of time (e.g. smaller than 20%). In such a situation, the control unit 108 may obtain the modulated signals according to the triggering events in each period. During the signal modulation period, the level of the reference voltage VR1 may still be adjusted according to the triggering ratio during the period of time having a larger triggering ratio, in order to exclude noise interference when there are changes in the system environment.

Figure 10:
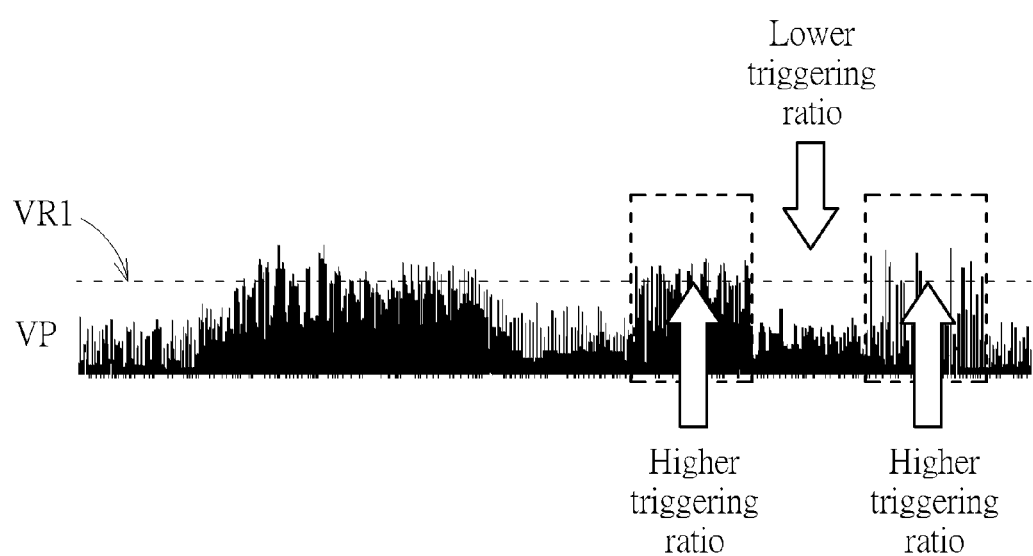
FIG. 10 is a waveform diagram of the positive voltage signal with noise interference during the signal modulation period according to an embodiment of the present invention.

Please refer to FIG. 10, which is a waveform diagram of the positive voltage signal VP with noise interference during the signal modulation period according to an embodiment of the present invention. As shown in FIG. 10, when the induction type power supply system is in operation, the signals may be disturbed due to system or environmental issues. In the prior art, the signals require a filter for demodulation, and the signal fluctuations due to noise interference may cause the demodulation results to be unclear. In comparison, in the embodiments of the present invention, an independent current signal S1 is obtained in each driving cycle, and each current signal S1 may generate a definite result, i.e. triggering or not triggering. The control unit 108 then determines the signal modulation situations according to the output results R1 or R2 of the comparators. In comparison with the prior art which uses a low-pass filter requiring more passive devices (e.g. resistors, capacitors or inductors) and easily has errors, the present invention may use fewer circuit elements where the main devices are highly integrated circuits, which enhances the stability therein.

Figure 11:
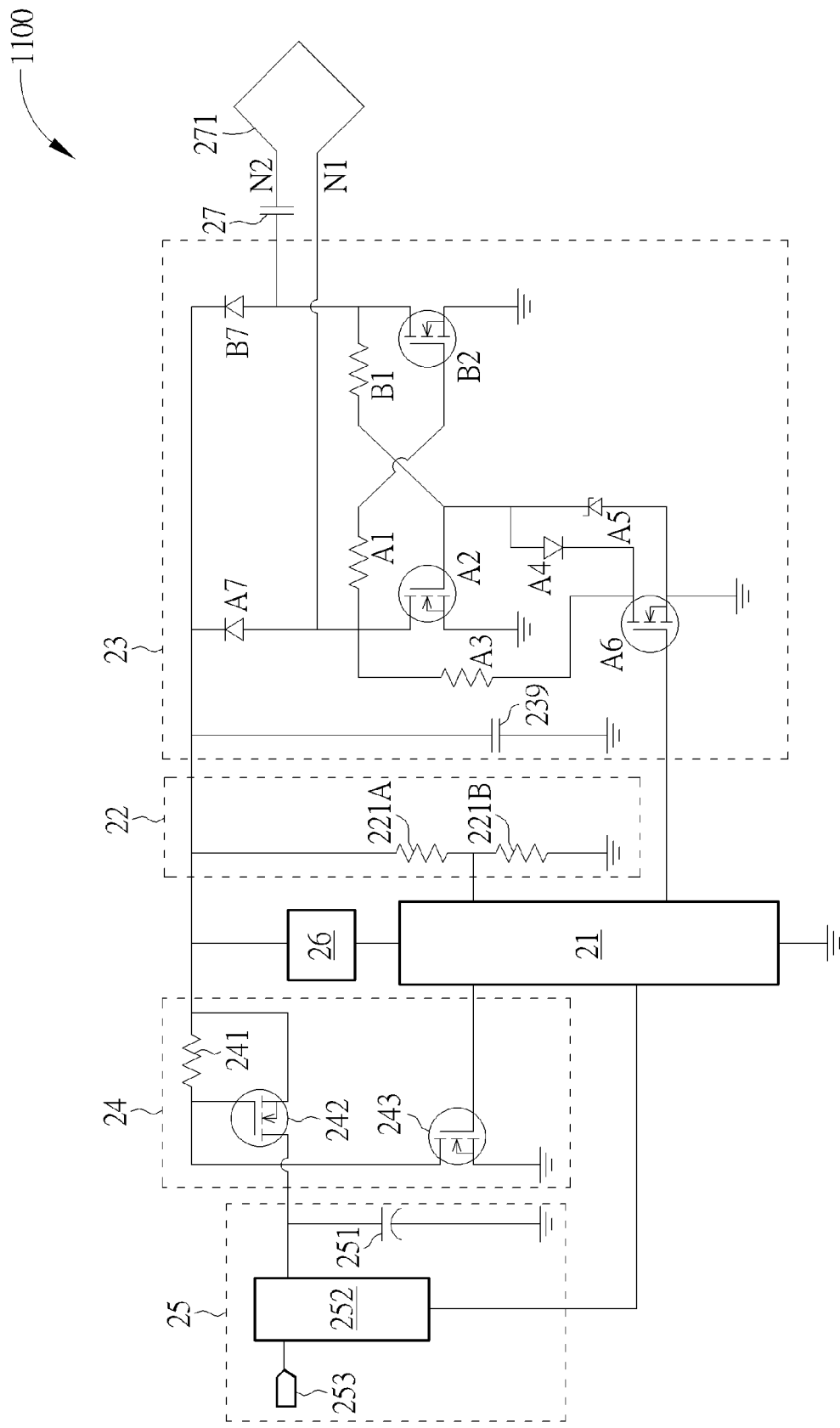
FIG. 11 is a schematic diagram of a receiving-end module with half-wave signal modulation functions.

Please note that the present invention may directly obtain the modulated signals according to the variations of the coil current without performing filtering on the signals. In an embodiment, the control unit 108 may interpret current variations in the positive half-cycle and the negative half-cycle, respectively, and then separate the current signal S1 corresponding to the forward current part and the backward current part to generate corresponding positive half-cycle current signals and negative half-cycle current signals, respectively. The control unit 108 then interprets the modulated signal according to the difference between the positive half-cycle current signals and the negative half-cycle current signals. In U.S. application Ser. Nos. 13/541,090 and 14/017,321, the receiving-end module mainly utilizes the full-wave signal modulation method to modulate data. The present invention uses the half-wave signal modulation method instead, so that a clear difference may appear between the positive half-cycle current signal and the negative half-cycle current signal. Please refer to FIG. 11, which is a schematic diagram of a receiving-end module 1100 with half-wave signal modulation functions. As shown in FIG. 11, the structure of the receiving-end module 1100 is similar to that of the receiving-end module 20 of U.S. application Ser. No. 14/017,321; hence, the elements and signals with the same functions are denoted by the same symbols. The main difference between the receiving-end module 1100 and the receiving-end module 20 of U.S. application Ser. No. 14/017,321 is that the signal feedback circuit 23 of the receiving-end module 1100 excludes the signal modulation resistor B3, the control diode B4, the zener diode B5 and the switch B6; the receiving-end module 1100 therefore performs half-wave signal modulation via the signal modulation resistor A3. Other modules and elements in the receiving-end module 1100 are disclosed in U.S. application Ser. No. 14/017,321, and will not be narrated herein.

Figure 12:
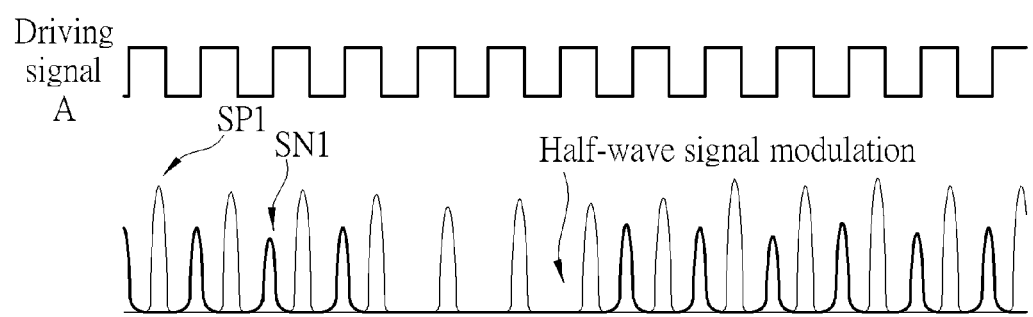
FIG. 12 is a schematic diagram of a positive half-cycle current signal and a negative half-cycle current signal with the half-wave signal modulation according to an embodiment of the present invention.

Please refer to FIG. 12, which is a schematic diagram of a positive half-cycle current signal SP1 and a negative half-cycle current signal SN1 with the half-wave signal modulation according to an embodiment of the present invention. As shown in FIG. 12, the positive half-cycle current signal SP1 and the negative half-cycle current signal SN1 may be generated from the current signal S1 by separating the coil current into a forward part and a backward part. During a no-modulation period, the positive half-cycle current signal SP1 and the negative half-cycle current signal SN1 both have certain variations, which may be generated from the load or noise interference and are similar to the variations generated by the full-wave signal modulation. After the power receiving end starts to perform half-wave signal modulation, the variations of the negative half-cycle current signal SN1 are obviously reduced, and the positive half-cycle current signal SP1 only undergoes a small change. In such a situation, the control unit 108 may perform signal interpretation according to the difference between the positive half-cycle current signal SP1 and the negative half-cycle current signal SN1. For example, the control unit 108 may determine that the power receiving end is modulating signals and start to read the modulated signals when the difference between variations of the positive half-cycle current signal SP1 and the negative half-cycle current signal SN1 exceeds a threshold value. Please note that the phase of half-wave modulation in the signal feedback circuit of the power receiving end should not be a limitation; variations in the current signal S1 fed back to the supplying-end coil 102 may appear in the positive half-cycle current signal SP1 or the negative half-cycle current signal SN1. The control unit 108 only needs to find out the difference between these two signals.

To sum up, the supplying-end module of the present invention provides a method of receiving data. This method can detect current variations on the supplying-end coil to obtain the data of the power receiving end without filtering. Such data may include the load information of the induction type power supply system, information of any metal object in the power receiving end or modulated signals generated in the receiving-end module, etc. The present invention uses a processor to directly process each current signal, so that resolution of the signals may significantly be enhanced and the processing speed may also increase. Since the filter is omitted, the supplying-end module requires fewer circuit elements, which gives the benefits of low cost and high reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current signal sensing method for a supplying-end module of an induction type power supply system, the supplying-end module comprising a supplying-end coil and a resonant capacitor, the method comprising:
   serially connecting a current sensing element between the supplying-end coil and the resonant capacitor to obtain a current signal corresponding to a current of the supplying-end coil; and
   interpreting the current signal to retrieve data of a receiving-end module of the induction type power supply system;
   wherein the current signal obtained by the current sensing element is used for determining a time point of the current of the supplying-end coil approaching zero.

2. The method of claim 1, wherein the step of interpreting the current signal to retrieve the data of the receiving-end module of the induction type power supply system comprises:
   not filtering the current signal before retrieving the data.

3. The method of claim 1, wherein the data comprises load information for indicating a load status of the induction type power supply system or whether there is a metal object in a load terminal.

4. The method of claim 3, wherein the step of interpreting the current signal to retrieve the data of the receiving-end module of the induction type power supply system comprises:
   determining the load status of the induction type power supply system according to a time difference between the time point of the current of the supplying-end coil approaching zero and a time point of switching driving signals in two terminals of the supplying-end coil, in order to retrieve the data.

5. The method of claim 4, wherein the step of determining the load status of the induction type power supply system according to the time difference between the time point of the current of the supplying-end coil approaching zero and the time point of switching the driving signals in the two terminals of the supplying-end coil in order to retrieve the data comprises:
   starting a timer when the driving signals in the two terminals of the supplying-end coil are switched;
   stopping the timer when the current of the supplying-end coil approaches zero; and
   determining the load status of the induction type power supply system according to the time difference obtained by the timer and a cycle of switching the driving signals in the two terminals of the supplying-end coil.

6. The method of claim 4, further comprising:
   determining that the load status of the induction type power supply system is no-load when the time difference is substantially equal to a quarter of the cycle of switching the driving signals in the two terminals of the supplying-end coil.

7. The method of claim 4, further comprising:
   determining that the load status of the induction type power supply system is full-load when the time difference is substantially equal to zero.

8. The method of claim 1, wherein the data comprises a modulated signal generated from the receiving-end module of the induction type power supply system.

9. The method of claim 8, wherein the step of interpreting the current signal to retrieve the data of the receiving-end module of the induction type power supply system comprises:
   amplifying a forward part and a backward part of the current signal, respectively, and converting the forward part and the backward part of the current signal into a positive voltage signal and a negative voltage signal, respectively;
   setting a first reference voltage and a second reference voltage;
   comparing the positive voltage signal with the first reference voltage to generate a positive half-cycle part of the modulated signal; and
   comparing the negative voltage signal with the second reference voltage to generate a negative half-cycle part of the modulated signal.

10. The method of claim 9, wherein a magnitude of the first reference voltage is adjusted according to a ratio of the positive voltage signal being greater than the first reference voltage during a specific period in which no modulate signals are generated in the receiving-end module, and a magnitude of the second reference voltage is adjusted according to a ratio of the negative voltage signal being greater than the second reference voltage during the specific period.

11. The method of claim 10, further comprising:
    increasing the magnitude of the first reference voltage when the ratio of the positive voltage signal being greater than the first reference voltage is greater than a first threshold value during the specific period; and
    decreasing the magnitude of the first reference voltage when the ratio of the positive voltage signal being greater than the first reference voltage is smaller than a second threshold value during the specific period.

12. The method of claim 10, further comprising:
    increasing the magnitude of the second reference voltage when the ratio of the negative voltage signal being greater than the second reference voltage is greater than a third threshold value during the specific period; and
    decreasing the magnitude of the second reference voltage when the ratio of the negative voltage signal being greater than the second reference voltage is smaller than a fourth threshold value during the specific period.

13. The method of claim 8, further comprising:
    utilizing a half-wave signal modulation method in the receiving-end module of the induction type power supply system to generate the modulated signal; and
    generating the current signal corresponding to the modulated signal in the supplying-end coil, and separating the current signal into a positive half-cycle current signal and a negative half-cycle current signal according to direction of the current in the supplying-end coil.

14. The method of claim 13, wherein the step of interpreting the current signal to retrieve the data of the receiving-end module of the induction type power supply system comprises:
    retrieving the data via a difference between variations of the positive half-cycle current signal and the negative half-cycle current signal.

15. A supplying-end module for an induction type power supply system comprising:
    a supplying-end coil;
    a resonant capacitor;
    a current sensing element, serially connected between the supplying-end coil and the resonant capacitor, for obtaining a current signal corresponding to a current of the supplying-end coil; and a control unit, coupled to the current sensing element, for interpreting the current signal to retrieve data of a receiving-end module of the induction type power supply system;

wherein the current signal obtained by the current sensing element is used for determining a time point of the current of the supplying-end coil approaching zero.

16. The supplying-end module of claim 15, wherein the current signal is not filtered before the control unit retrieves the data.

17. The supplying-end module of claim 15, wherein the data comprises load information for indicating a load status of the induction type power supply system or whether there is a metal object in a load terminal.

18. The supplying-end module of claim 17, wherein the control unit determines the load status of the induction type power supply system according to a time difference between the time point of the current of the supplying-end coil approaching zero and a time point of switching driving signals in two terminals of the supplying-end coil, in order to retrieve the data.

19. The supplying-end module of claim 18, wherein the control unit comprises:
a timer, for calculating the time difference between the time point of the current of the supplying-end coil approaching zero and the time point of switching the driving signals in the two terminals of the supplying-end coil;
wherein the control unit determines the load status of the induction type power supply system according to the time difference obtained by the timer and a cycle of switching the driving signals in the two terminals of the supplying-end coil.

20. The supplying-end module of claim 18, wherein the load status of the induction type power supply system is determined to be no-load when the time difference is substantially equal to a quarter of the cycle of switching the driving signals in the two terminals of the supplying-end coil.

21. The supplying-end module of claim 18, wherein the load status of the induction type power supply system is determined to be full-load when the time difference is substantially equal to zero.

22. The supplying-end module of claim 15, wherein the data comprises a modulated signal generated from the receiving-end module of the induction type power supply system.

23. The supplying-end module of claim 22, further comprising a signal interpretation circuit, the signal interpretation circuit comprising:
a first amplifier and a second amplifier, for amplifying a forward part and a backward part of the current signal, respectively, and converting the forward part and the backward part of the current signal into a positive voltage signal and a negative voltage signal, respectively;
a first voltage generator and a second voltage generator, for respectively setting a first reference voltage and a second reference voltage;
a positive half-cycle comparator, for comparing the positive voltage signal with the first reference voltage to generate a positive half-cycle part of the modulated signal; and
a negative half-cycle comparator, for comparing the negative voltage signal with the second reference voltage to generate a negative half-cycle part of the modulated signal.

24. The supplying-end module of claim 23, wherein a magnitude of the first reference voltage is adjusted according to a ratio of the positive voltage signal being greater than the first reference voltage during a specific period in which no modulate signals are generated in the receiving-end module, and a magnitude of the second reference voltage is adjusted according to a ratio of the negative voltage signal being greater than the second reference voltage during the specific period.

25. The supplying-end module of claim 24, wherein the magnitude of the first reference voltage is increased when the ratio of the positive voltage signal being greater than the first reference voltage is greater than a first threshold value during the specific period, and the magnitude of the first reference voltage is decreased when the ratio of the positive voltage signal being greater than the first reference voltage is smaller than a second threshold value during the specific period.

26. The supplying-end module of claim 24, wherein the magnitude of the second reference voltage is increased when the ratio of the negative voltage signal being greater than the second reference voltage is greater than a third threshold value during the specific period, and the magnitude of the second reference voltage is decreased when the ratio of the negative voltage signal being greater than the second reference voltage is smaller than a fourth threshold value during the specific period.

27. The supplying-end module of claim 22, wherein the receiving-end module of the induction type power supply system utilizes a half-wave signal modulation method to generate the modulated signal.

28. The supplying-end module of claim 27, further utilized for generating the current signal corresponding to the modulated signal, and the control unit separates the current signal into a positive half-cycle current signal and a negative half-cycle current signal according to direction of the current of the supplying-end coil.

29. The supplying-end module of claim 28, wherein the control unit retrieves the data via a difference between variations of the positive half-cycle current signal and the negative half-cycle current signal.

* * * * *